(12) United States Patent
Kirkpatrick et al.

(10) Patent No.: US 7,049,242 B2
(45) Date of Patent: May 23, 2006

(54) POST HIGH VOLTAGE GATE DIELECTRIC PATTERN PLASMA SURFACE TREATMENT

(75) Inventors: Brian K. Kirkpatrick, Allen, TX (US); Rajesh Khamankar, Coppell, TX (US); Malcolm J. Bevan, Dallas, TX (US); April Gurba, Plano, TX (US); Husam N. Alshareef, Murphy, TX (US); Clinton L. Montgomery, Coppell, TX (US); Mark H. Somervell, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 242 days.

(21) Appl. No.: 10/752,886

(22) Filed: Jan. 6, 2004

(65) Prior Publication Data

US 2004/0142570 A1    Jul. 22, 2004

Related U.S. Application Data

(60) Provisional application No. 60/438,111, filed on Jan. 6, 2003.

(51) Int. Cl.
*H01L 21/302* (2006.01)

(52) U.S. Cl. .................... 438/706; 438/275
(58) Field of Classification Search ............ 438/706, 438/275
See application file for complete search history.

(56) References Cited

U.S. PATENT DOCUMENTS

2004/0067619 A1 * 4/2004 Niimi et al. ............ 438/275

* cited by examiner

*Primary Examiner*—Nadine G. Norton
*Assistant Examiner*—Patricia George
(74) *Attorney, Agent, or Firm*—Yingsheng Tung; Wade James Brady, III; Frederick J. Telecky, Jr.

(57) ABSTRACT

The present invention provides a method for fabricating a dual gate semiconductor device. In one aspect, the method comprises forming a nitridated, high voltage gate dielectric layer over a semiconductor substrate, patterning a photoresist over the nitridated, high voltage gate dielectric layer to expose the nitridated, high voltage dielectric within a low voltage region wherein the patterning leaves an accelerant residue on the exposed nitridated, high voltage gate dielectric layer. The method further includes subjecting the exposed nitridated, high voltage dielectric to a plasma to remove the accelerant residue.

21 Claims, 11 Drawing Sheets

| Split | Wfr | Mean Thick (Å) | Normalized Delta from Target | Stdev | %Stdev | Range | Split |
|---|---|---|---|---|---|---|---|
| 1 | 1 | 11.42 | 0.42 | 0.60 | 5.29 | 1.98 | D-PN, No HVGX Pattern, With BHF |
|  | 2 | 10.48 | -0.52 | 0.76 | 7.27 | 2.34 |  |
|  | 3 | 10.55 | -0.45 | 0.68 | 6.48 | 2.14 |  |
| 2 | 4 | 19.73 | 0.73 | 2.55 | 12.91 | 7.57 | D-PN, HVGX Pattern, No BHF |
|  | 5 | 19.37 | 0.37 | 1.13 | 5.81 | 3.28 |  |
|  | 6 | 18.85 | -0.15 | 1.37 | 7.27 | 4.05 |  |
| 3 | 7 | 11.88 | 0.88 | 0.39 | 3.27 | 1.24 | D-PN, HVGX Pattern, Plasma Treatment 1, BHF |
|  | 8 | 11.45 | 0.45 | 0.41 | 3.56 | 1.27 |  |
|  | 9 | 10.17 | -0.83 | 0.30 | 2.96 | 0.79 |  |
| 4 | 10 | 11.68 | 0.68 | 0.47 | 4.02 | 1.45 | D-PN, HVGX Pattern, Plasma Treatment 2, BHF |
|  | 11 | 11.70 | 0.70 | 0.35 | 2.95 | 1.11 |  |
|  | 12 | 10.22 | -0.78 | 0.52 | 5.09 | 1.56 |  |
| 5 | 13 | 20.04 | 9.04 | 0.74 | 3.69 | 1.90 | D-PN, HVGX Pattern, Treatment 1 w/o Plasma, BHF |
|  | 14 | 19.90 | 8.90 | 1.03 | 5.19 | 3.40 |  |
|  | 15 | 17.97 | 6.97 | 2.03 | 11.32 | 7.11 |  |
| 6 | 16 | 20.44 | 9.44 | 1.46 | 7.16 | 4.98 | D-PN, HVGX Pattern, Treatment 2 w/o Plasma, BHF |
|  | 17 | 20.20 | 9.20 | 0.93 | 4.61 | 2.92 |  |
|  | 18 | 20.75 | 9.75 | 2.34 | 11.26 | 7.96 |  |
| 7 | 19 | 16.68 | 5.68 | 1.24 | 7.43 | 3.83 | D-PN, HVGX Pattern, Treatment 3 w/o Plasma, BHF |
|  | 20 | 14.79 | 3.79 | 1.35 | 9.14 | 3.82 |  |
|  | 21 | 11.19 | 0.19 | 1.22 | 10.87 | 3.05 |  |
| 8 | 22 | 10.01 | 0.25 | 0.22 | 2.19 | 0.68 | No D-PN, HVGX Pattern, BHF |
|  | 23 | 10.11 | 0.15 | 0.22 | 2.20 | 0.61 |  |
|  | 24 | 10.68 | -0.42 | 0.18 | 1.66 | 0.48 |  |

FIGURE 3

POST HIGH VOLTAGE GATE DIELECTRIC PATTERN PLASMA SURFACE TREATMENT

CROSS-REFERENCE TO PROVISIONAL APPLICATION

This application claims the benefit of U.S. Provisional Application No. 60/438,111 entitled "POST HIGH VOLTAGE GATE OXIDE PATTERN PLASMA SURFACE TREATMENT," to Kirkpatrick, et al., filed on Jan. 6, 2003, which is commonly assigned with the present invention and incorporated herein by reference as if reproduced herein in its entirety.

TECHNICAL FIELD OF THE INVENTION

The present invention is directed, in general, to a method for manufacturing a dual gate integrated circuit and, more specifically, to a method for improving the surface uniformity over a low voltage area using a post pattern plasma treatment that is conducted subsequent to a nitridation process of a high voltage gate dielectric.

BACKGROUND OF THE INVENTION

Dual gate integrated circuits having both high voltage (HV) devices, which may also be referred to herein as input/output (I/O) devices, and low voltage (LV), or core, devices have gained wide acceptance and utility in the semiconductor industry since their introduction. In addition, however, there is a great demand for shrinking these semiconductor devices to provide an increased device density on the semiconductor chip and provide chips that are faster and consume less power. In fact, to provide the required device performance, the scaling of the gate dielectric thickness in these devices has now reached below 2.5 nm.

However, simply scaling standard dielectrics while maintaining good process control in this thickness regime is very difficult. Thus, the industry is left with the desire to use thicker films that are correspondingly easier to control to tight limits, while using the existing equipment, and decreasing the electrical dielectric thickness to increase device performance (increase $I_{DS}$) with less leakage and without degradation to long channel threshold voltages.

To achieve these goals, the industry has turned to the use of high dielectric constant (high-k) materials. One such high-k film that has found popular utility is a plasma nitridated oxide or (PNO). In this process, a remote or decoupled nitrogen plasma or other known method for nitridation is used to implant silicon dioxide with uniformly high doses of nitrogen. The addition of this nitrogen effectively increases the dielectric constant value of the gate dielectric, thus allowing a physically thicker film to be electrically thinner.

Initially, these nitridation processes were used for the LV device due to the fact that its gate dielectric thickness was thinner than the gate dielectric of the HV device. Thus, a high-k material for the HV devices was not required because the overall scale of the integrated circuit had not reached the point that required the use of such a material in the I/O area. As such, plasma nitridation was not used on the high voltage area, but with the advent of less than 2.5 nm HV devices, nitridation of the HV region is now highly desirable for a fully robust device.

Unfortunately, however, the industry has been experiencing problems when both the HV gate dielectric and LV gate dielectric are nitridated. More specifically, the industry has begun to notice a roughening of the underlying base silicon in the LV device area. FIG. 1 is a transmission electron microscope (TEM) photo of a silicon surface 10 wherein the LV dielectric layer 15 was conventionally formed using a dual plasma nitridation process in which both the HV gate dielectric and the LV gate dielectric were nitridated. As seen in this figure, the silicon surface 10 is irregular or roughened at 10a. Layer 17 is a poly gate electrode subsequently formed on top of the previously roughened LV dielectric. This condition is highly undesirable because roughened silicon has several disadvantages, including lower intrinsic reliability, additional variation in the optical thickness measurements used for inline process control, and increase variation in ramped voltage breakdown metrics.

Accordingly, what is needed in the art is a method of manufacturing an integrated circuit that does not produce a roughened silicon surface when subjected to a dual nitridation process.

SUMMARY OF THE INVENTION

To address the above-discussed deficiencies of the prior art, the present invention provides a method for fabricating a dual gate semiconductor device. In one embodiment, the method comprises forming a nitridated, high voltage gate dielectric layer over a semiconductor substrate, patterning a photoresist over the nitridated, high voltage gate dielectric layer to expose the nitridated, high voltage dielectric within a low voltage region. The patterning leaves an accelerant residue on the exposed nitridated, high voltage gate dielectric layer. The exposed, high voltage gate dielectric layer is subsequently subjected to a plasma to remove the accelerant residue.

In another aspect, the present invention provides a dual gate integrated circuit. In this particular embodiment, the dual gate integrated circuit includes high voltage gate transistors located on a semiconductor substrate with each having a nitridated, high voltage gate dielectric located thereunder and low voltage gate transistors located on the semiconductor substrate with each having a nitridated, low voltage gate dielectric located thereunder. Each of the low voltage gate dielectrics has substantially a uniform thickness within about 1 nm of a target thickness of the low voltage gate dielectric. The device further includes source/drain regions associated with each of the high voltage and low voltage transistors, dielectric layers located over the high voltage and low voltage transistors, and interconnects extending through the dielectric layers to interconnect the high voltage and low voltage transistors to form an operative integrated circuit.

In yet another embodiment, the present invention provides a method for manufacturing a dual gate integrated circuit. In this embodiment, the method includes forming a nitridated, high voltage gate dielectric layer over a semiconductor substrate, patterning a photoresist over the nitridated, high voltage gate dielectric layer to expose the nitridated, high voltage dielectric within a low voltage region. The patterning leaves an accelerant residue on the exposed nitridated, high voltage gate dielectric layer. The exposed nitridated, high voltage dielectric is subsequently subjected to a plasma to remove the accelerant residue.

This method further includes forming a nitridated, low voltage gate dielectric layer over the semiconductor substrate within the low voltage regions, forming high voltage gate transistors over the nitridated, high voltage gate dielectric layer. It further includes forming low voltage gate transistors over the nitridated, low voltage gate dielectric layer, forming source/drain regions associated with each of the high voltage and low voltage transistors, forming dielectric layers located over the high voltage and low voltage transistors, and forming interconnects extending through the dielectric layers to interconnect the high voltage and low voltage transistors to form an operative integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which:

FIG. 3 illustrates a table that further presents data that indicates the presence of the accelerant residue and its effect on the measured thickness of the LV gate dielectric and the benefits of its removal by the process covered by the present invention;

DETAILED DESCRIPTION

The present invention uniquely recognizes that a nitridation of a HV dielectric layer and subsequent patterning of a photoresist over a LV region leaves an accelerant residue that, based on observations, effectively increases or enhances the etch rate of a wet etchant such that the etchant significantly etches into the silicon substrate lying under the accelerant residue. It has presently been found that when the wet etch is conducted on an exposed nitridated, HV gate dielectric layer in the LV region, the accelerant residue, if not removed, enhances the etching rate of the etchant. This enhancement causes the etchant to etch into the silicon and roughen the silicon surface at a rate greater than it normally would if the accelerant residue were not present.

As a result, wherever the accelerant residue is present on the nitridated, HV gate dielectric, it has been observed that the silicon is removed at a much greater rate than in those areas where the accelerant residue is not present. This results in a roughened or bumpy silicon surface, which is undesirable for the reasons stated in the Background. In contrast, in those areas where the accelerant residue is not present, the silicon surface is not roughened to the extent beyond desired design parameters.

It should be specifically understood that this accelerant residue is not a "photoresist scum" in the conventional sense. Indeed, it essentially functions like a reverse scum or anti-scum. In a conventional scumming situation, when a photoresist scum covers a portion of a surface, such as an dielectric, it protects that surface from the etchant, which leaves the underlying surface essentially unaffected, except for any undercut etching that might occur. This is in stark contrast to the accelerant residue recognized by the present invention in that the accelerant residue does not protect the area that it covers. To the contrary, it increases the etch rate of the wet etchant such that it significantly etches into the underlying silicon substrate. In addition, conventional scum can be detected with a scanning electron microscope (SEM), whereas the accelerant residue is not detectable by a SEM or any similar qualitative tool presently available.

Further, both the de-scum ash and ashing processes are well known in the industry, but are procedurally different from the present process. For example, a de-scum ashing process is conducted at a temperature of about 80° C. for an extended period of time that ranges from 20 seconds to about 1 minute in some cases. This amount of time is necessary to insure a complete removal of the scum. The ashing process, on the other hand may be conducted at temperatures of around 150° C. to 300° C. for a period of time ranging from about 1 minute to about 10 minutes to insure complete removal of the photoresist residue.

Figure 1:
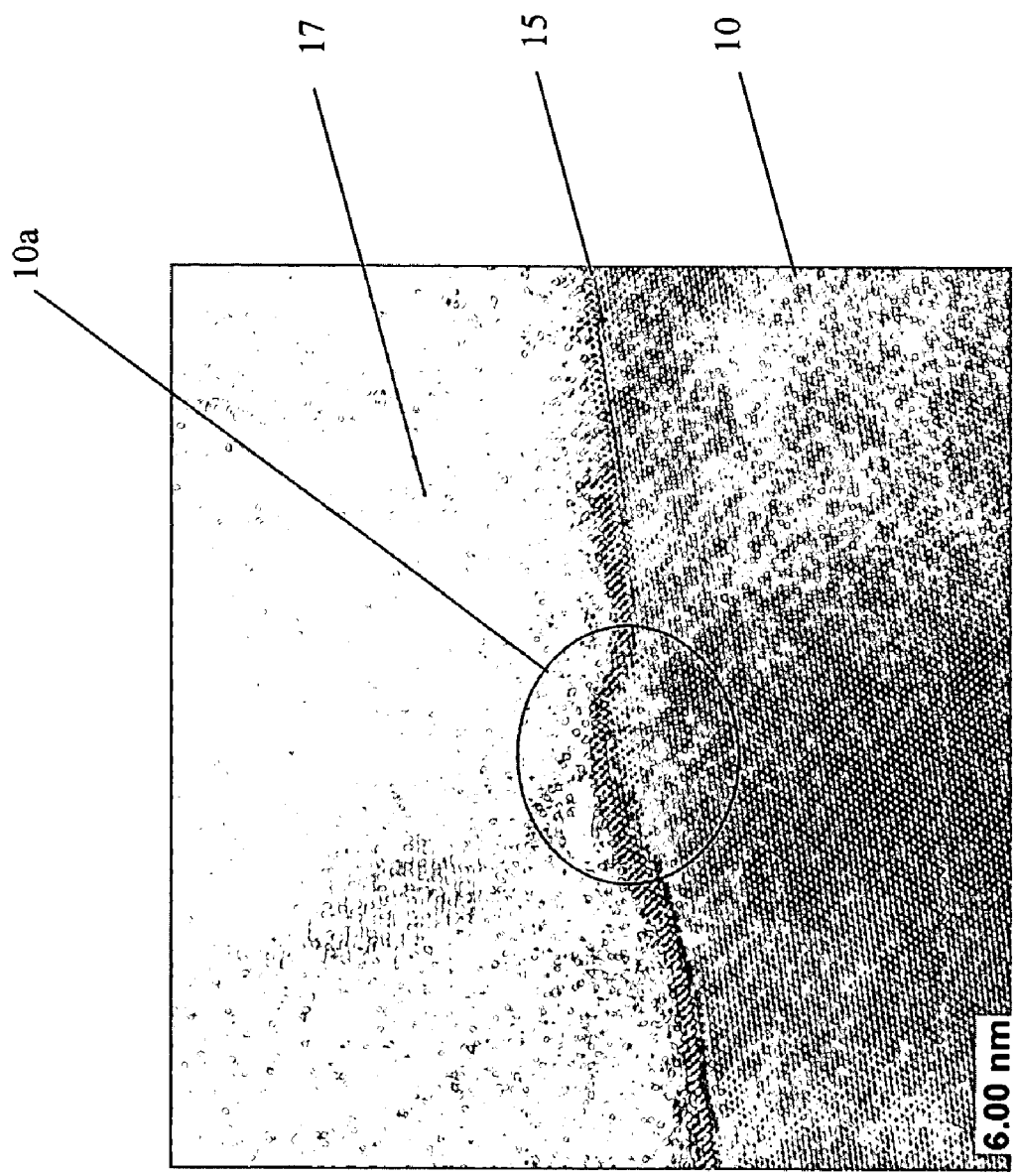
FIG. 1 illustrates a TEM photo of a roughened silicon surface of a device fabricated in accordance with conventional processing techniques.
Figure 2:
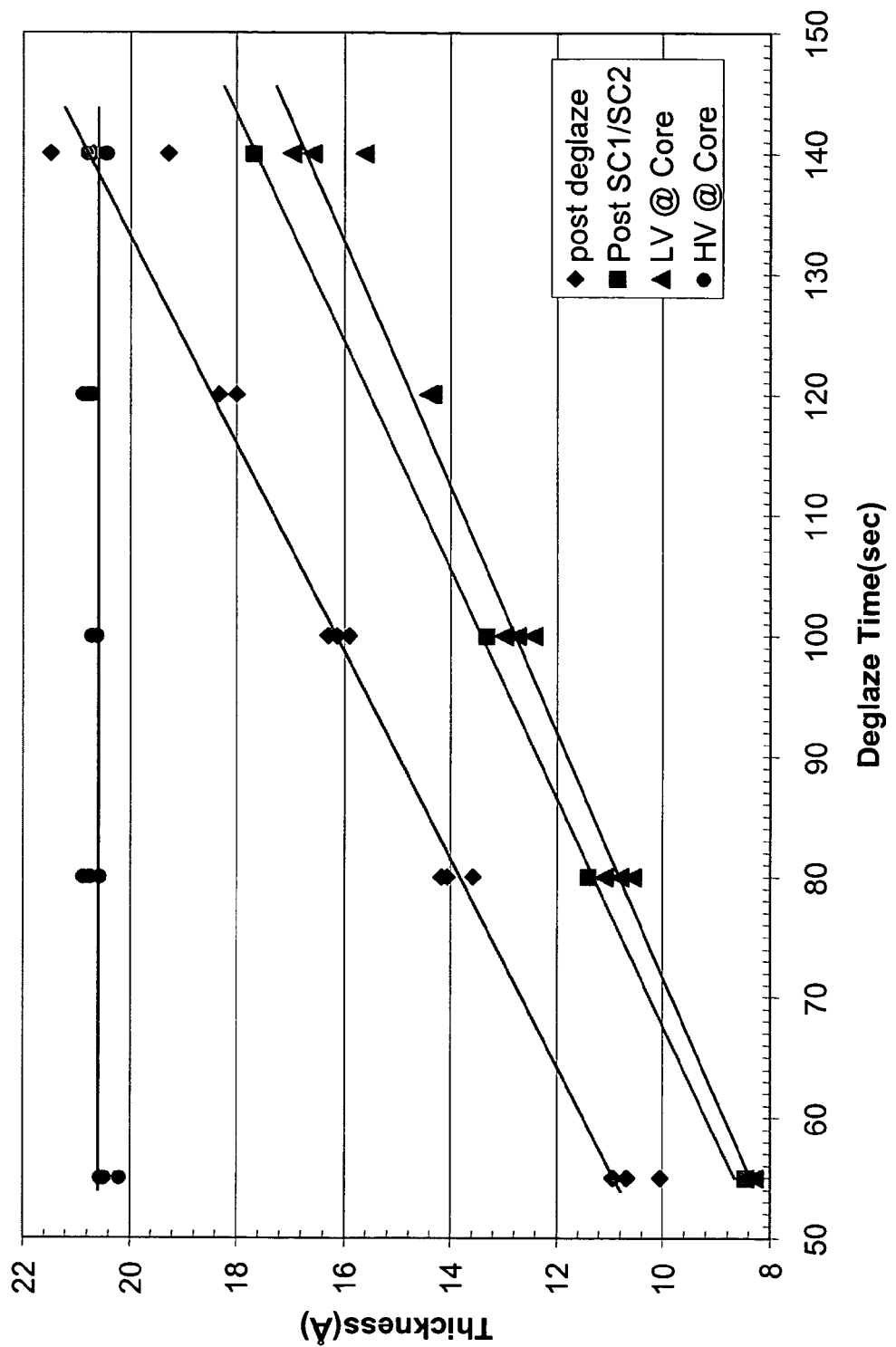
FIG. 2 illustrates a graph that depicts the effects that exposure time of a silicon substrate to a wet etchant has on the measured thickness of a LV gate dielectric, as measured with an ellipsometer.

In the process of discovering the presence of the accelerant residue, deglaze tests were conducted on a dual nitridated gate device. FIG. 2 is a graph that illustrates the effects that exposure time of a silicon substrate to a wet etchant has on the measured thickness of a LV gate dielectric, as measured with an ellipsometer. The measurements were taken on devices fabricated in a conventional manner. HV gate dielectric layers were grown over the subject wafers and nitridated using a plasma nitridation wherein nitrogen is introduced into the plasma environment. Following nitridation of the HV gate dielectric layers, a photoresist was deposited and patterned to expose the HV gate dielectric layers located over the LV regions. The exposed HV gate dielectric layers were then conventionally removed with an etchant, and a LV gate dielectric layer was grown in the exposed areas and nitridated with a plasma nitridation process.

As generally seen in FIG. 2, the longer the LV regions were exposed to the etchant, the larger the value of the measured thickness of the LV gate dielectric layer, which is an indication of the degree of surface roughness, as understood by those skilled in the art. While the chemical composition of the accelerant residue or the chemical reactions with the etchant and silicon substrate are not presently known, it should be understood that the present invention recognizes the presence of the accelerant residue and presents a unique method for removing it. However, given the chemical composition of the photoresist and the fact that nitridation of the HV gate dielectric causes roughening of the silicon substrate, it is theorized that the accelerant residue may be a chemical interaction between the wet etch, the photoresist residue and nitrogen present in the underlying dielectric and/or silicon substrate.

FIG. 3 is a table that further presents data that indicates the presence of the accelerant residue and its affect on the measured thickness of the LV gate dielectric and the benefits of its removal by the process covered by the present invention.

FIG. 3 is a table of ellipsometric measurements taken of the LV gate dielectrics located on different wafers and fabricated with different processing steps or conditions.

In Split 1, which covered wafers 1 through 3, the LV gate dielectric was fabricated using a plasma nitridation process on the HV gate dielectric, but no photoresist was used to mask off the HV gate dielectric. BHF was used to remove the HV gate dielectric over the LV region. As seen from FIG. 3, this process yielded a LV gate dielectric having a mean thickness ranging from about 1.048 nm to about 1.142 nm, which is a desirable target thickness range. The same desirable thickness range was found using split 8 covering wafers 22 through 24, where no nitridation process was used on the HV gate dielectric layer, photoresist was used to pattern the LV gate region. BHF was used to remove the HV gate dielectric over the LV region. As seen from FIG. 3, this process also yielded a LV gate dielectric having a desirable range (about 1.001 to about 1.068 nm) suggesting minimum to no silicon roughening.

Taking into account the change in desirable thickness range one would expect if the BHF is left off, Split 2 covering wafers 4 through 6 shows the effect of nitridating the HV gate dielectric layer, using photoresist to pattern the LV region and then not using BHF to remove the HV gate dielectric over the LV region. In this case, thickness values from about 1.885 to about 1.973 nm was a desirable outcome.

The result of these three splits drove the conclusion that the presence of a previously nitridated dielectric and photoresist was part of an interaction with the BHF causing roughened silicon, since there was little affect on the mean thickness when any one of the three components was not present.

With continued reference to FIG. 3, in Split 3 and 4, which covers wafers 7 through 9 and 10 through 12, respectively, a plasma nitridation process was conducted as before, and the HV gate dielectric was patterned with a photoresist. However prior to the BHF etching process, the wafers were subjected to a plasma treatment, which is discussed in more detail below. From this data, it is apparent that these wafers had a LV gate dielectric whose measured thickness ranged from about 1.017 nm to about 1.188 nm. Again, these acceptable target thickness ranges are in distinct contrast to the thicknesses obtained in Split 5 and 6 which covers wafers 13 through 15 and 16 through 18, respectively.

As seen from FIG. 3, all steps were the same as Split 3 and 4, except the plasma treatment of the present invention was omitted with undesirable results of LV gate dielectric measured thickness. These larger thickness measurements indicated significant silicon roughening in the LV region.

However, in Split 7, which covers wafers 19 through 21, a plasma nitridation was conducted, but in place of the plasma treatment, the device was subjected to a high-vacuum step. From the data it is evident that the high vacuum out gassing significantly reduces the mean dielectric thickness back toward baseline levels and thus provides an alternative means for removing the accelerant residue. These results suggest that with optimized time and pressure, the residual photo-chemicals can be removed from the surface.

Looking at Split 8 again, which covers wafers 22 through 24, no plasma nitridation was conducted, which resulted in desirable LV gate dielectric measured thickness and minimal to no silicon roughening. Given the need to have an HV and LV gate and increase the dielectric constant on both, omission of the photo pattern or the plasma nitridation process as was done in Split 1 and 8, respectively, are not viable manufacturing choices.

Upon observing the measured thickness results of the wafers manufactured by processes not covered by the present invention and processes covered by the present invention, it was readily apparent that when a plasma nitridation process was used on the HV gate dielectric, a residue was being left after the photoresist was patterned. It was also apparent that this residue interacted with the etchant used to remove the HV gate dielectric and accelerated or enhanced the etching properties of the etchant, such that after removing the HV dielectric, it significantly etched into the underlying silicon surface and roughened it. With an explanation of how the residue was realized, the unique process used to remove it will now be discussed in detail.

Figure 4A:
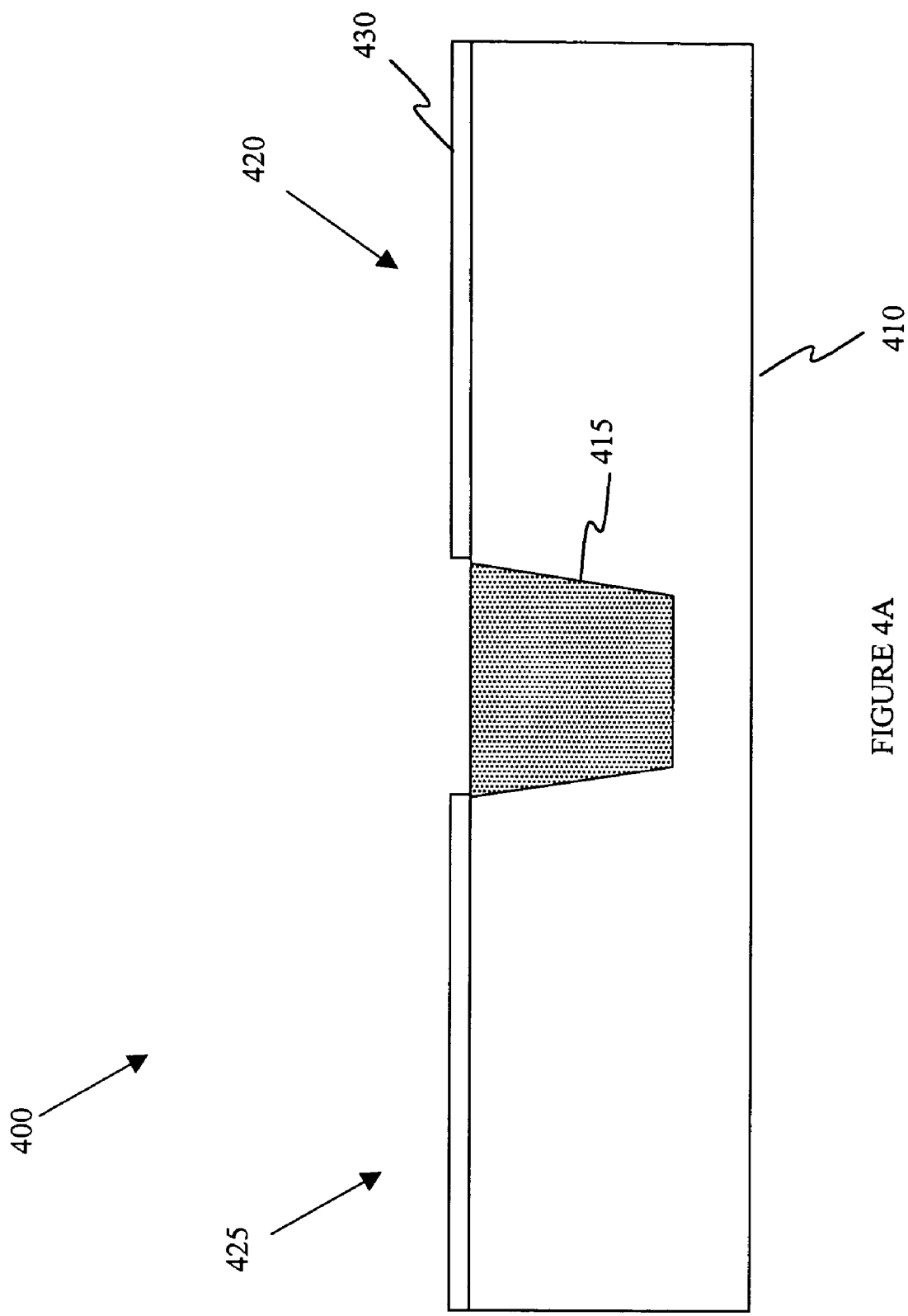
FIG. 4A illustrates a sectional view of a LV/HV device at an early stage of manufacture.

Turning initially to FIG. 4A, there is illustrated a sectional view of a LV/HV device 400 at an early stage of manufacture. In this particular view, there is illustrated a semiconductor substrate 410, such as a silicon substrate, having a conventional isolation structure 415 formed therein. For purposes of discussion here, the isolation structure 415 divides the semiconductor substrate 410 into a HV region 420 and a LV region 425. Also shown is a HV gate dielectric layer 430 that has been conventionally grown over the semiconductor substrate 410, including the LV region 425. In one advantageous embodiment, the dielectric layer 430 may be an oxide layer, such as a silicon dioxide. However, other dielectrics known to those skilled in the art are also within the scope of the present invention.

Figure 4B:
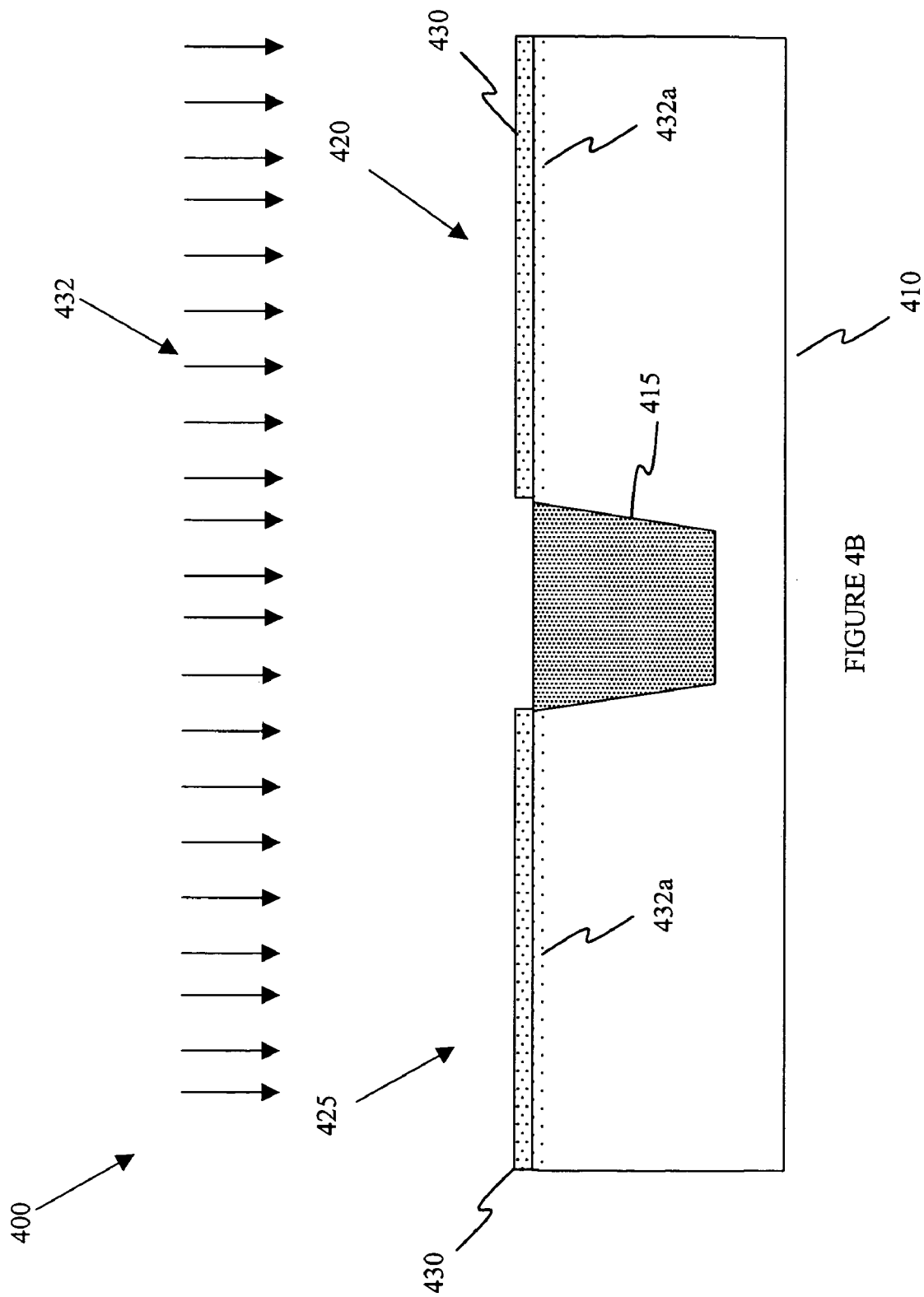
FIG. 4B illustrates sectional view of the LV/HV device of FIG. 4A following the formation of the HV gate dielectric layer as it is being subjected to a nitridation process.

Following the formation of the HV gate dielectric layer 430, it is subjected to a nitridation process 432, indicated by the arrows, as shown in FIG. 4B. In one embodiment, the nitridation process 432 may be a dual plasma nitridation process that employs a decoupled or remote plasma process. In such embodiments, the nitridation process includes a plasma nitridation process that employs a decoupled or remote plasma process. In such embodiments, the nitridation process includes the use of nitrogen radicals to incorporate nitrogen into the gate dielectric layer. The nitrogen radicals are generated using nitrogen gas and an RF or microwave plasma source. Other gasses may also be present during the nitridation process. However, other nitridation processes, such as thermal nitridation using a vertical furnace or single-wafer reactor with N2, NO or $N_2O$ gasses might also be used. As seen from FIG. 4B, it should be noted that some of the nitrogen, which is shown as the lesser dense dots and designated 432a, is incorporated into the underlying silicon semiconductor substrate 410.

Figure 4C:
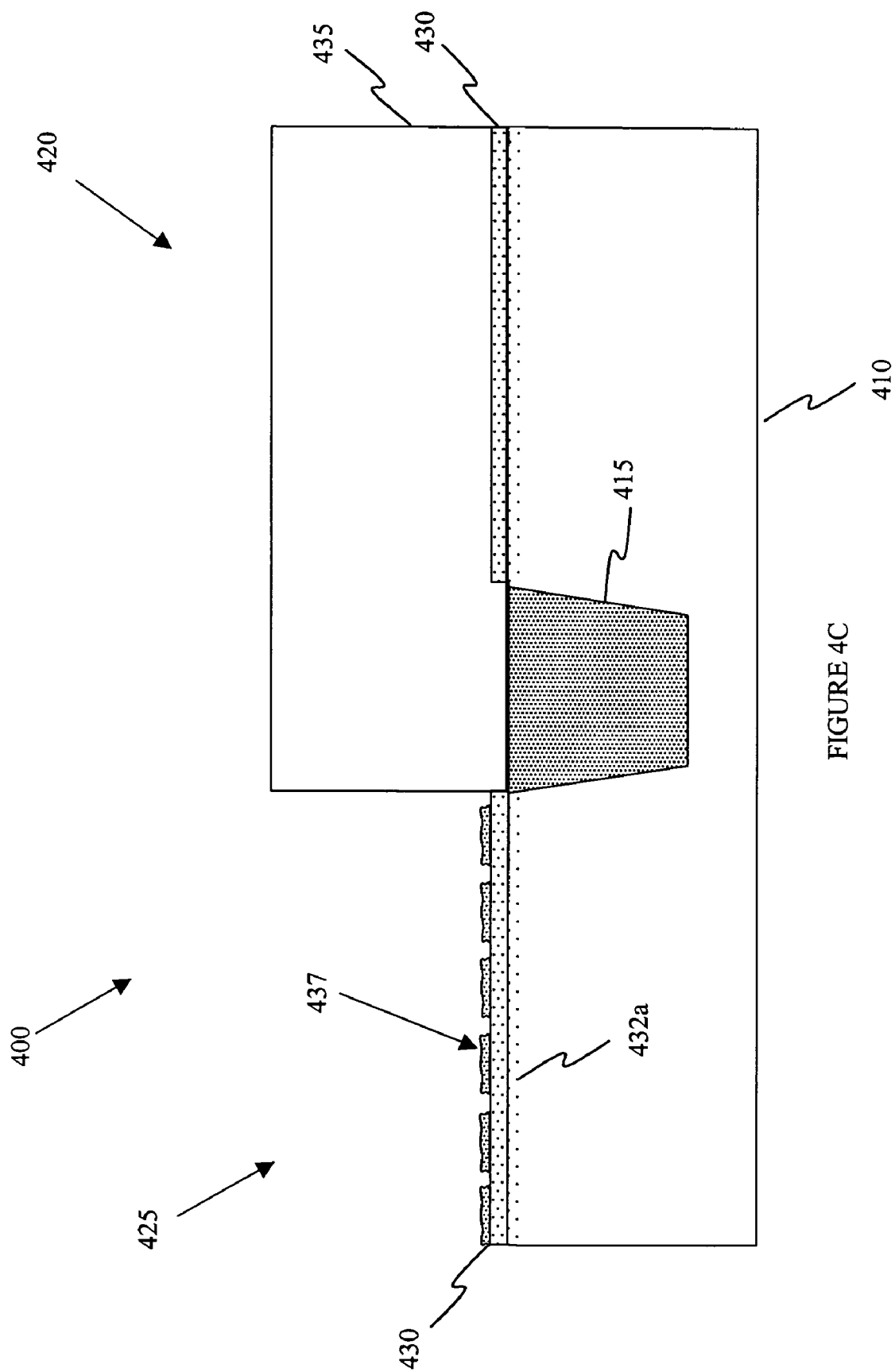
FIG. 4C illustrates a sectional view of the LV/HV device of FIG. 4B after the nitridation of the HV dielectric layer and conventional deposition and patterning of a photoresist that protects the HV region and exposes the LV region for removal of the HV dielectric layer over the LV region use a wet etch process.

Referring now to FIG. 4C, after the nitridation of the HV dielectric layer 430, a conventional photoresist 435 is deposited and patterned to protect the HV region 420 and expose the LV region 425 for removal of the HV dielectric layer 430 in the LV region 425 using a wet etch process. Based on observations discussed above, it has been found that during the photoresist patterning process, a residue 437 of the photoresist 425 is left on the exposed HV dielectric layer 430, as shown in FIG. 4C, and as also discussed above, this residue 437 accelerates or enhances the etching properties of the wet etch, and if not removed, it roughens the surface of the semiconductor substrate 410 by etching into the underlying silicon.

Figure 4D:
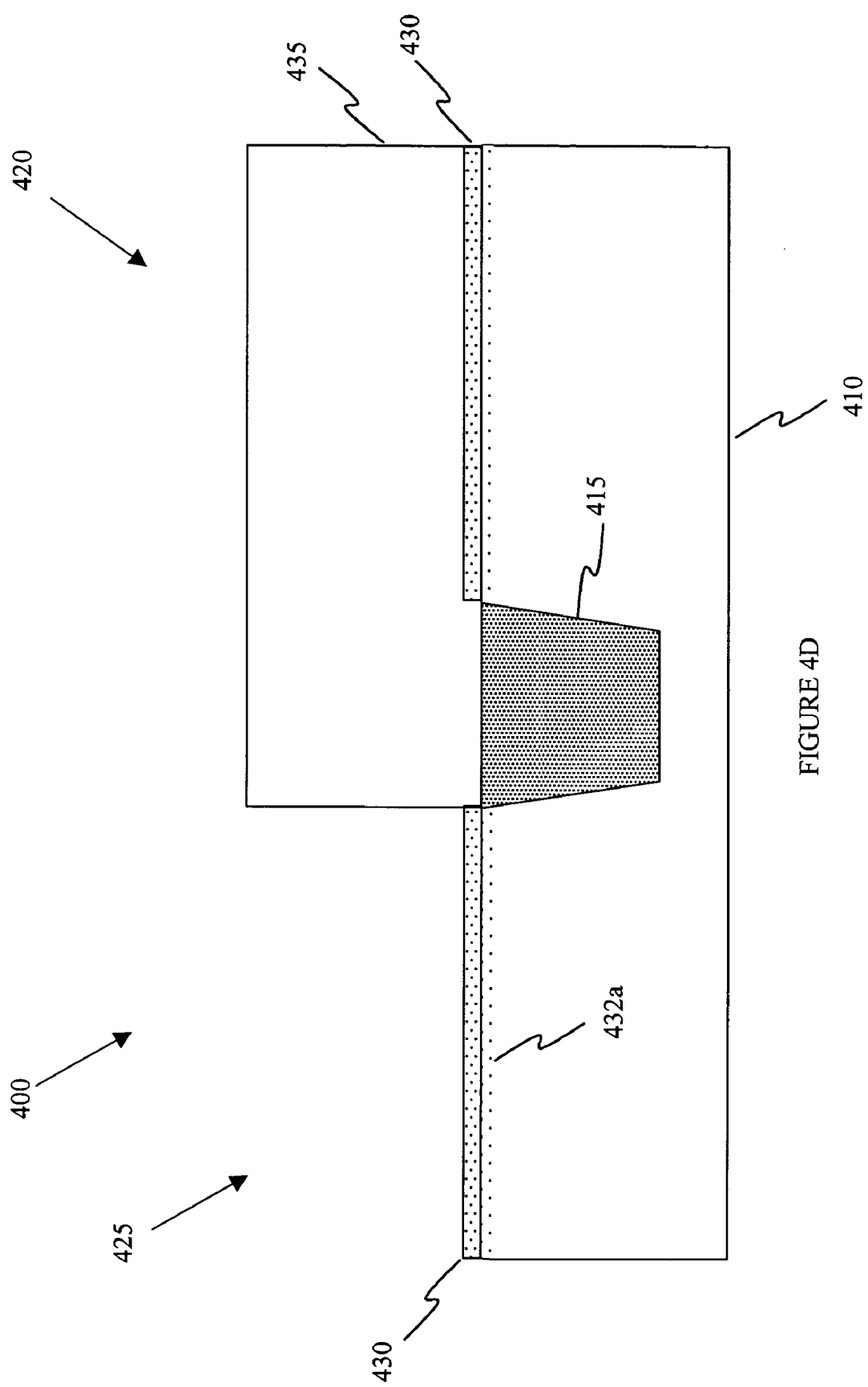
FIG. 4D illustrates a sectional view of the LV/HV device of FIG. 4C after the removal using a plasma process of the residue, which minimizes roughening of the substrate.

With reference now to FIG. 4D, the LV/HV device 400 is subjected to a plasma treatment that effectively removes the residue 437, and which, in turn, minimizes roughening of the substrate 410 during a subsequent wet etch process. In one embodiment, the plasma comprises a gas mixture of oxygen and a forming gas mixture of nitrogen and hydrogen. The flow rates of these gases may vary. However, in one embodiment, the flow rate of the oxygen may be about 1500 sccm and the flow rate of the mixture of nitrogen and hydrogen may be about 1000 sccm. Also because the residue 437 is not a conventional scum, it is not necessary to subject the LV/HV device 400 to the plasma for periods of time as found in convengtional de-scumming processes. In fact, it is desirable that the time range from about 3 seconds to about 60 seconds.

In one embodiment, the treatment may be conducted for 11 seconds or 22 seconds. However, in a more advantageous embodiment, the time is about 10 seconds. The temperature may also vary, but should not exceed the glass transition temperature $T_g$ of the photoresist used (about 140° C. in this embodiment). Otherwise, damage to the photoresist pattern will occur blocking the subsequent removal of nitridated high voltage dielectric in some of the LV regions. In one embodiment, the temperature within the vacuum chamber may range from about 20° C. (i.e., room temperature) to about five degree less than the glass transition temperature ($T_g$) of the photoresist used in this embodiment. In an exemplary embodiment, the temperature of the plasma is preferably about 80° C., with the time to reach that temperature ranging from about 0 seconds to about 180 seconds. The wattage of the plasma may range from about 100 watts to about 2000 watts with a preferred wattage being about 1000 watts. Finally, the pressure within the tool may vary as well and may range from about 3 torr to about 1 torr, with an advantageous operation pressure being about 1.5 torr.

Figure 4E:
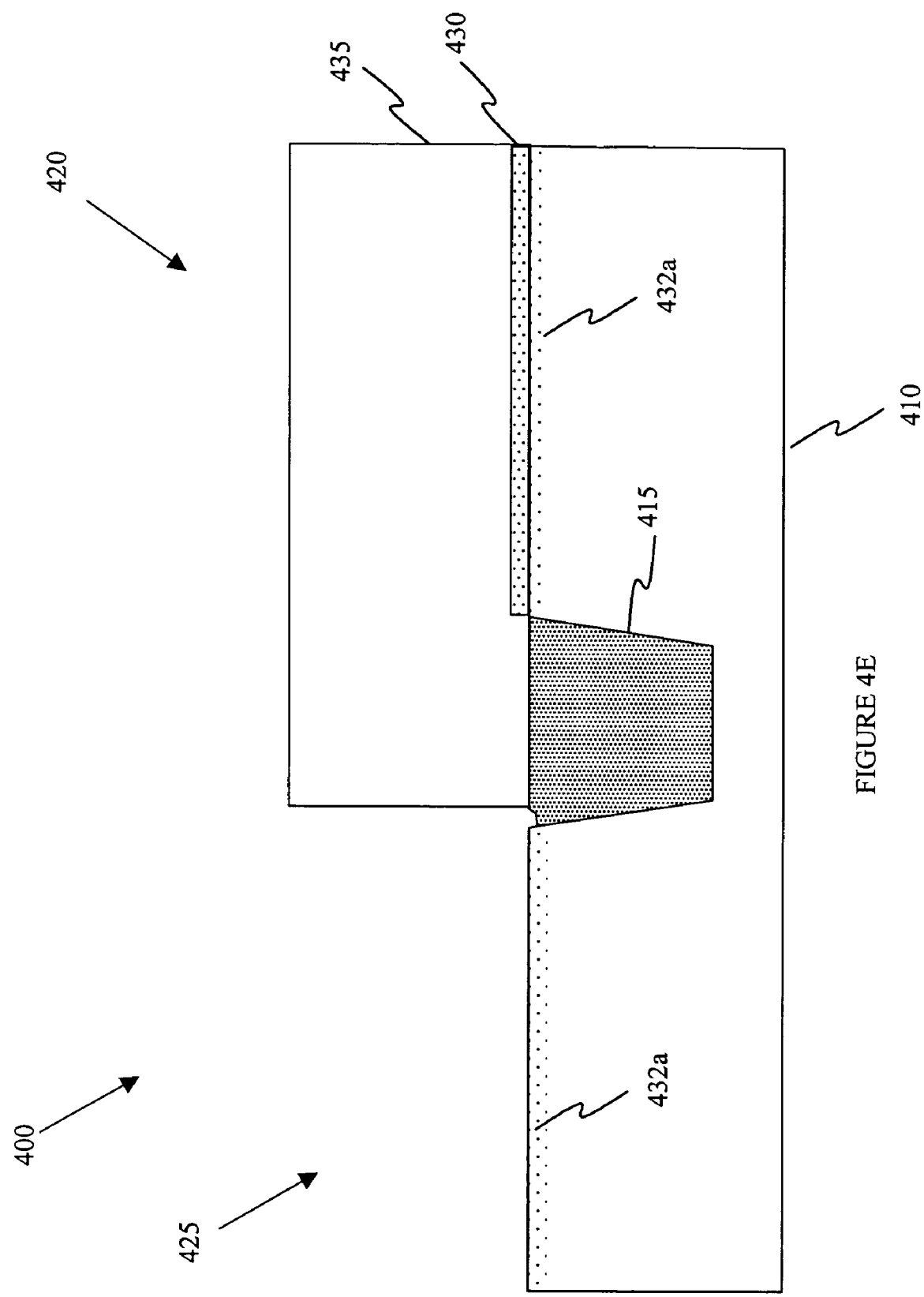
FIG. 4E illustrate a sectional view of the LV/HV device of FIG. 4D following the plasma treatment and conventional wet etch to remove the HV dielectric layer from the LV region 425.

Turning now to FIG. 4E, following the plasma treatment, which slightly pulls back the photoresist 435 and removes a small portion of the isolation structure 415, a conventional wet etch is conducted to remove the HV dielectric layer 430 from the LV region 425. With the residue 437 either completely or substantially gone, a substantially smoother semiconductor substrate 410 can be achieved. In fact, samples fabricated using the present invention were analyzed with an atomic force microscope, which revealed that the samples subjected to the plasma treatment had root mean squared (RMS) values ranging from about 0.2 nm to about 0.5 nm, and a goodness of fit between the semiconductor substrate and the nitridated low voltage gate dielectrics ranging from about 0.997 to about 0.999. Both of these, RMS values indicated minimal to no significant roughening of the semiconductor substrate 410. In one aspect of the present invention, the wet etch may comprise BHF. However, other etchants or etching components, such as HF, HF/H2O2, ozone sulfuric acid or hydrogen peroxide, might also be used either alone on in conjunction with the BHF.

Figure 4F:
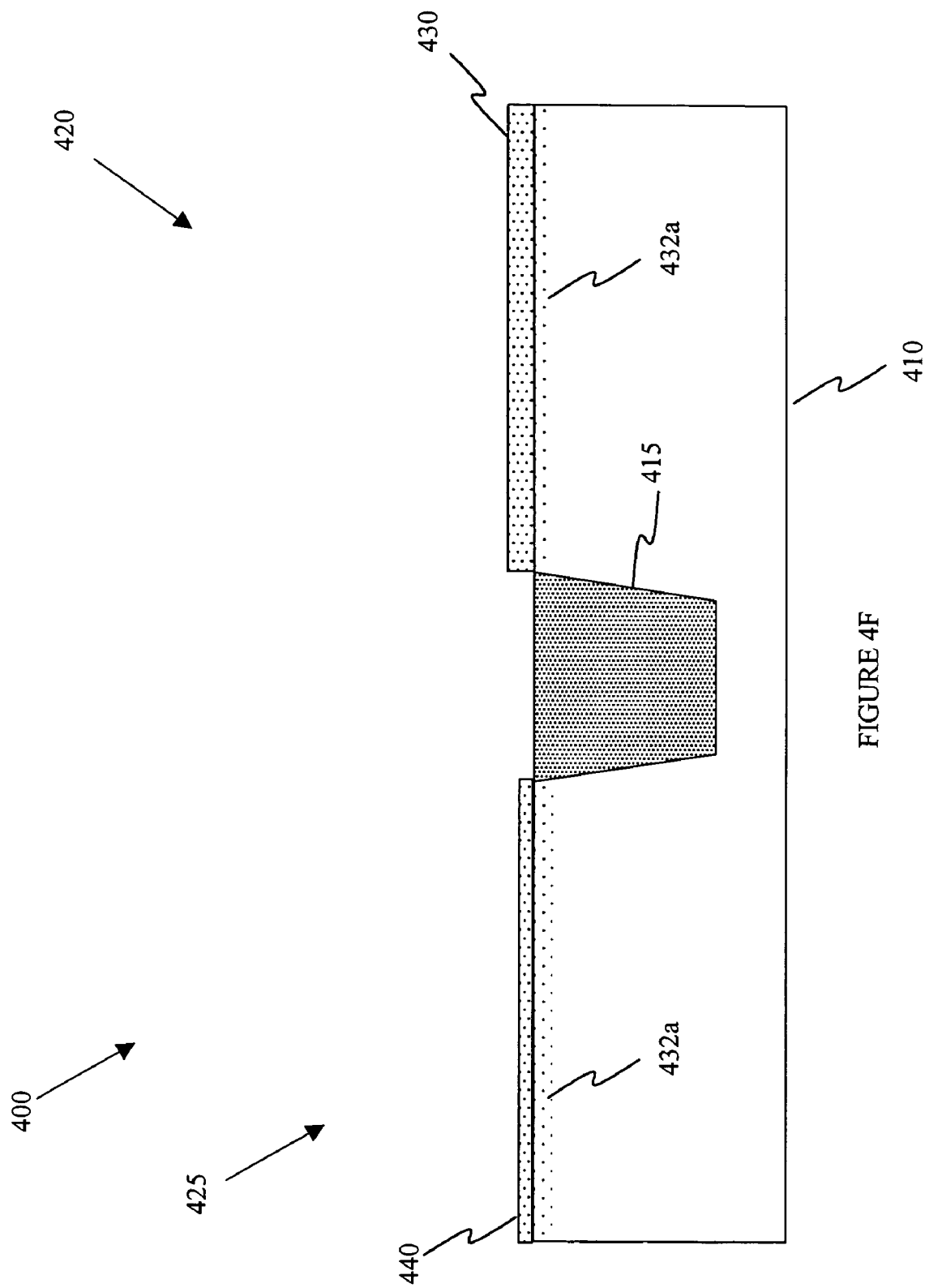
FIG. 4F illustrates a sectional view of the LV/HV device of FIG. 4E photoresist is removed and the LV Gate dielectric is formed, wherein the wafer is left with a LV and HV gate dielectric.

Turning now to FIG. 4F, in a further aspect of the present invention, after the HV gate dielectric layer 430 is removed from the LV region 425, the photoresist 435 is removed from the HV region 420 and a LV gate dielectric 440 is conventionally grown in the LV region. The LV gate dielectric 440 may then be subjected to a nitridation process to nitridate the LV gate dielectric 440 and thereby increase its dielectric constant. It should be noted that the HV gate dielectric 430 is subjected to both the growing process, which increases its thickness, and to the nitridation, which double nitridates the HV gate dielectric 430.

Figure 5:
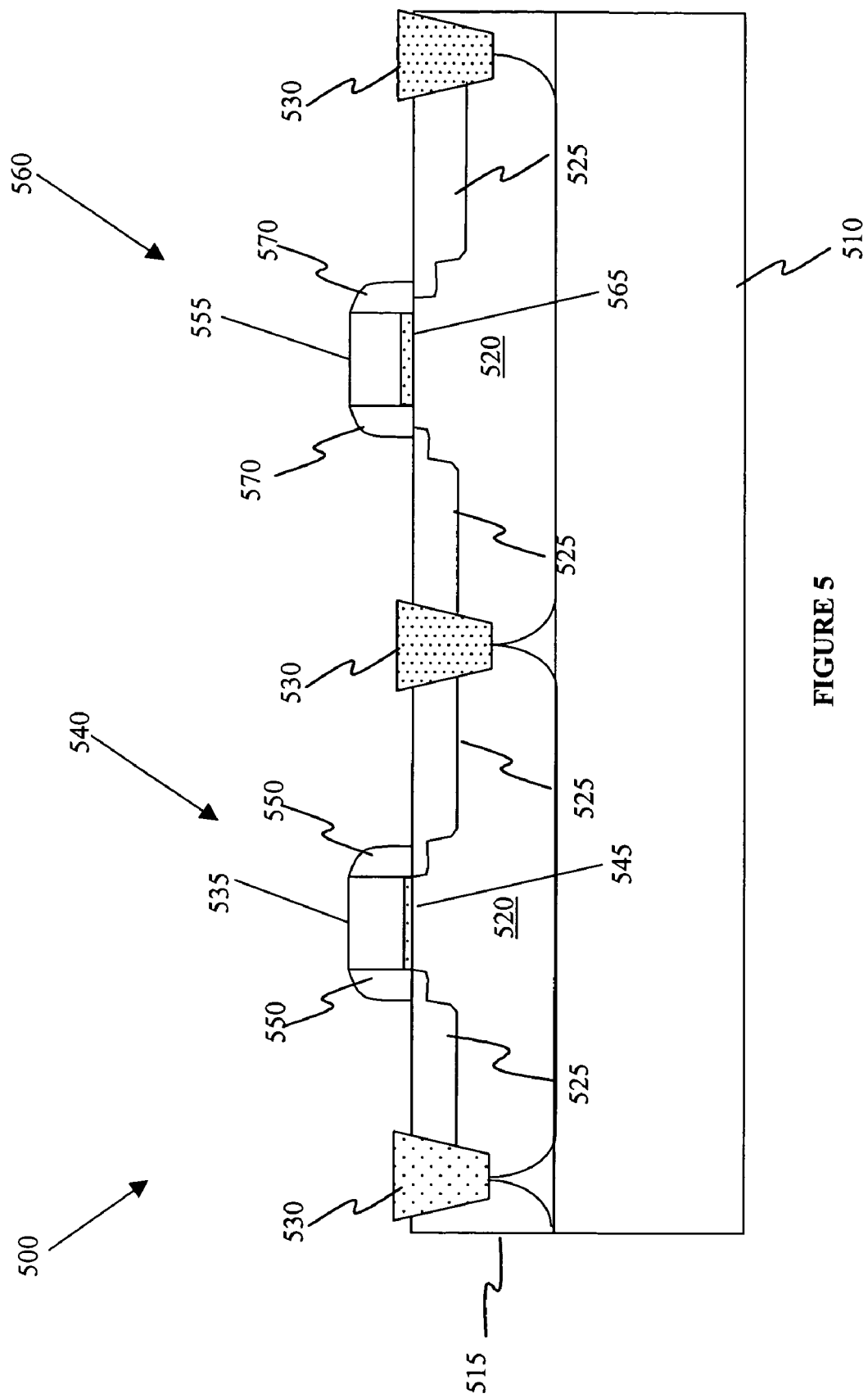
FIG. 5 illustrates a sectional view of the device shown in FIG. 4F after the conventional formation of dual gates.

Turning now to FIG. 5, there is illustrated a sectional view of the device shown in FIG. 4F after the conventional formation of dual gates. In the illustrated embodiment, the dual voltage device 500 includes a semiconductor substrate 510 over which is formed a tub or well layer 515 in which wells 520 and source/drain regions 525 are formed. The wells 520 are electrically isolated by conventionally formed isolation structures 530. A low voltage gate 535 is formed over a LV region 540 and is isolated from the well 520 using a nitridated, low voltage gate dielectric layer 545 formed in accordance with the present invention. This yields a uniform thickness of the low voltage gate dielectric across the device that is within about 1 nm of a target thickness of the low voltage gate dielectric. In a more specific embodiment, it is within 1.1 nm+0.1 nm of the target thickness. Depending on design rules and application, the target thickness may range from about 0.6 nm to about 1.4 nm. However, other target thicknesses as dictated by design are also within the scope of the present invention. The low voltage gate 535 also includes spacers 550. Shown adjacent the low voltage gate 535 for clarity is a high voltage gate 555 formed over a HV region 560 and is isolated from the well 520 use a nitridated, high voltage gate dielectric layer 565 formed in accordance with the present invention. The high voltage gate 555 also includes spacers 570. Also, the dual voltage device 500 may be also include metal silicide contact regions on the source/drain regions 525, which are not shown, and it may also be incorporated into an integrated circuit, as shown in FIG. 6.

Figure 6:
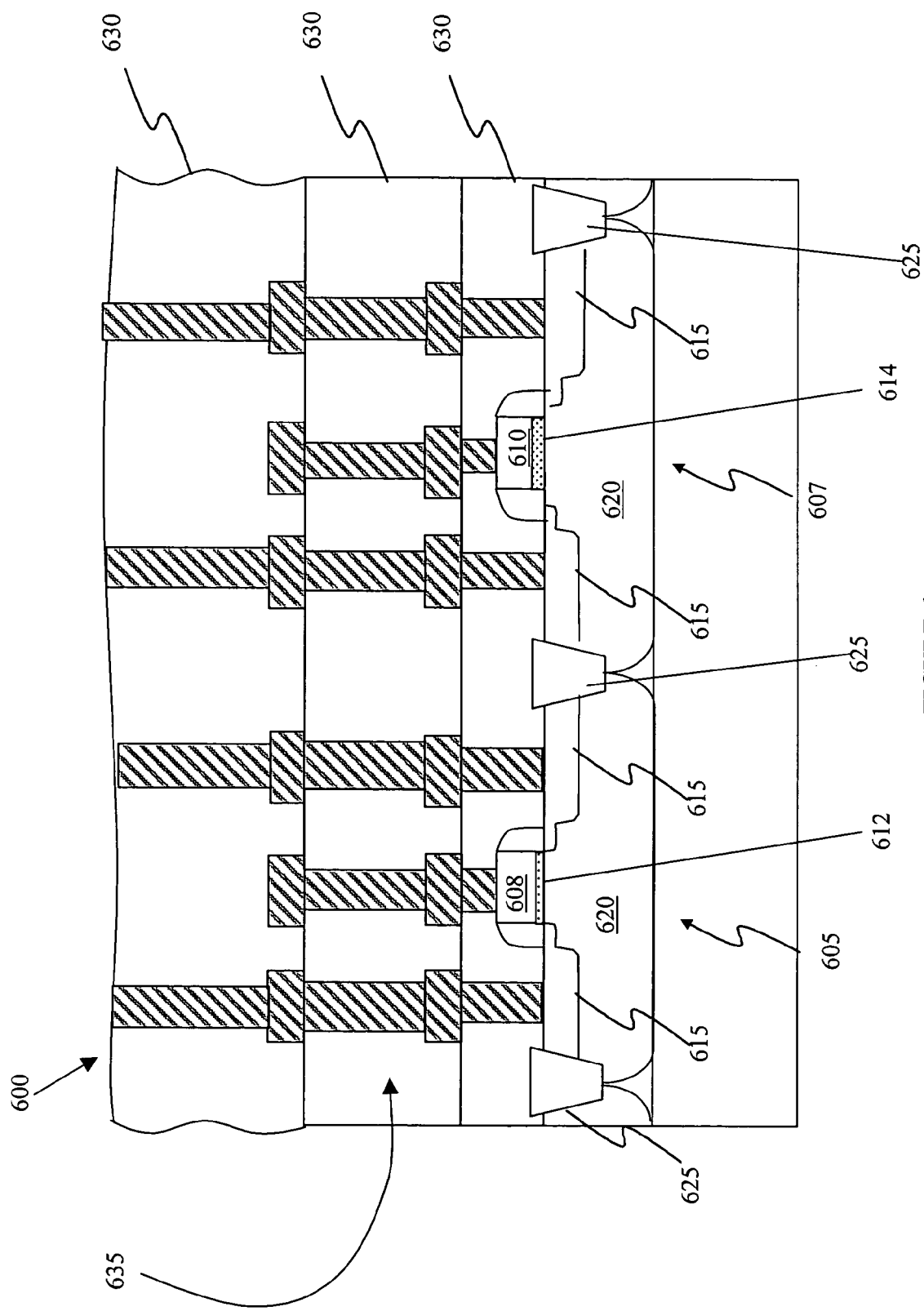
FIG. 6 illustrates a partial view of a dual voltage integrated circuit device that can be fabricated in accordance with the principles of the present invention.

FIG. 6 represents a partial view of a dual voltage integrated circuit device 600 that can be fabricated in accordance with the principles of the present invention. The integrated circuit 600 includes low voltage transistors 605 and high voltage transistors 607 that each respectively include a low voltage gate 608 and a high voltage gate 610. The gates 608 and 610 are designed to operate at their respective designed operating voltages. The low voltage gate 608 is electrically isolated by a nitridated, low voltage gate dielectric 612, and the high voltage gate 610 is electrically isolated by a nitridated, high voltage gate dielectric 614, both of which may be fabricated in accordance with the principles of the present invention.

The transistors 605 and 607 also each includes source/drains 615 formed in wells 620, which can be doped as desired. Conventional isolation structures 625, separate and electrically isolate the transistors 605 and 607 from each other. Interlevel dielectric layers 630 are located over the transistors 605 and 607 and interconnects 635 are formed therein to interconnect the various transistors 605 and 607 to form an operative integrated circuit. Given the teachings of present application, one who is skilled in the art would know how to form the operative integrated circuit as shown in FIG. 6.

Although the present invention has been described in detail, those skilled in the art should understand that they can make various changes, substitutions and alterations herein without departing from the spirit and scope of the invention in its broadest form.

What is claimed is:

1. A method for fabricating a dual gate semiconductor device, comprising:
   forming a nitridated, high voltage gate dielectric layer over a semiconductor substrate;
   patterning a photoresist over said nitridated, high voltage gate dielectric layer to expose said nitridated, high voltage dielectric within a low voltage region, said patterning leaving an accelerant residue on said exposed nitridated, high voltage gate dielectric layer; and
   subjecting said exposed nitridated, high voltage dielectric to a plasma to remove said accelerant residue.

2. The method as recited in claim 1 wherein said plasma is conducted at a wattage ranging from about 100 watts to about 2000 watts and at a pressure ranging from about 1 torr to about 3 torr.

3. The method as recited in claim 1 wherein said accelerant residue acts as an accelerant for buffered hydrogen fluoride to increase a silicon etch rate of said buffered hydrogen fluoride.

4. The method as recited in claim 1 further including etching said nitridated, high voltage gate dielectric subsequent to said subjecting.

5. The method as recited in claim 1 further including forming a nitridated, low voltage gate dielectric over said low voltage region subsequent to said etching.

6. The method as recited in claim 1 wherein forming said nitridated, high voltage gate dielectric layer includes nitridating said high voltage gate dielectric layer using a decoupled nitridation process or a remote nitridation process.

7. The method as recited in claim 1 wherein said gate dielectric layer is silicon dioxide.

8. The method as recited in claim 1 wherein said subjecting includes a plasma wherein said plasma is conducted at a temperature ranging from about 20° C. to about five degrees less than the glass transition temperature of said photoresist and for a time ranging from about 3 seconds to about 60 seconds.

9. The method as recited in claim 2 wherein said temperature is about 80° C. and said time is about 10 seconds.

10. The method as recited in claim 1 wherein said plasma includes a gas mixture comprising oxygen and a forming gas mixture of nitrogen and hydrogen.

11. The method as recited in claim 10 wherein a flow of said oxygen is about 1500 sccm and a flow of said nitrogen and said hydrogen is about 1000 sccm.

12. A method for manufacturing A dual gate integrated circuit, comprising:
   forming a nitridated, high voltage gate dielectric layer over a semiconductor substrate;
   patterning a photoresist over said nitridated, high voltage gate dielectric layer to expose said nitridated, high voltage dielectric within a low voltage region, said patterning leaving an accelerant residue on said exposed nitridated, high voltage gate dielectric layer; and
   subjecting said exposed nitridated, high voltage dielectric to a plasma to remove said accelerant residue;
   forming a nitridated, low voltage gate dielectric layer over said semiconductor substrate within said low voltage regions;
   forming high voltage gate transistors over said nitridated, high voltage gate dielectric layer;
   forming low voltage gate transistors over said nitridated, low voltage gate dielectric layer;
   forming source/drain regions associated with each of said high voltage and low voltage transistors;
   forming dielectric layers located over said high voltage and low voltage transistors; and
   forming interconnects extending through said dielectric layers to interconnect said high voltage and low voltage transistors to form an operative integrated circuit.

13. The method as recited in claim 12 each of said low voltage gates has substantially a uniform thickness within about 1 nm of a target thickness of said low voltage gate dielectric.

14. The method as recited in claim 12 wherein said subjecting includes a plasma wherein said plasma is conducted at a temperature ranging from about 20° C. to about five degrees less than the glass transition temperature of said photoresist and for a time ranging from about 3 seconds to about 60 seconds.

15. The method as recited in claim 12 wherein said plasma includes a forming gas mixture comprising oxygen and a mixture of nitrogen and hydrogen and wherein a flow of said oxygen is about 1500 sccm and a flow of said nitrogen and said hydrogen is about 1000 sccm.

16. The method as recited in claim 12 wherein said plasma is conducted at a wattage ranging from about 100 watts to about 2000 watts and at a pressure ranging from about 1 torr to about 3 torr.

17. The method as recited in claim 12 wherein said accelerant residue acts as an accelerant for buffered hydrogen fluoride to increase a silicon etch rate of said buffered hydrogen fluoride.

18. The method as recited in claim 12 wherein a goodness of fit between said semiconductor substrate and said nitridated, low voltage gate dielectric layer ranges from about 0.997 to about 0.999.

19. The method as recited in claim 12 wherein said gate dielectric layer is silicon dioxide.

20. The method as recited in claim 12 further including etching said nitridated, high voltage gate dielectric subsequent to said subjecting.

21. The method as recited in claim 20 wherein said etching includes using buffered hydrogen fluoride.

* * * * *